United States Patent [19]
Kotzin et al.

[11] Patent Number: 5,412,690
[45] Date of Patent: May 2, 1995

[54] METHOD AND APPARATUS FOR RECEIVING ELECTROMAGNETIC RADIATION WITHIN A FREQUENCY BAND

[75] Inventors: Michael D. Kotzin, Buffalo Grove; Joseph Schuler, Roselle, both of Ill.

[73] Assignee: Motorola, Inc., Schaumburg, Ill.

[21] Appl. No.: 27,997

[22] Filed: Mar. 8, 1993

[51] Int. Cl.$^6$ .......................................... H04L 27/00
[52] U.S. Cl. ..................................... 375/256; 370/70; 348/398
[58] Field of Search .................... 375/35, 103, 25, 27; 381/36, 37; 455/33.1, 33.3, 306, 314, 313, 189.1, 225, 303, 150.1; 370/70, 50, 123, 495; 348/398

[56] References Cited

U.S. PATENT DOCUMENTS

| | | | |
|---|---|---|---|
| 4,048,443 | 9/1977 | Crochiere et al. | 179/1 SA |
| 4,112,374 | 9/1978 | Steinbrecher . | |
| 4,230,956 | 10/1980 | Steinbrecher . | |
| 4,817,182 | 3/1989 | Adelson et al. | 348/398 |
| 4,914,701 | 4/1990 | Zibman | 381/36 |
| 4,955,078 | 9/1990 | Chung | 455/244 |
| 5,021,801 | 6/1991 | Smith | 455/33.3 |
| 5,115,309 | 5/1992 | Hang | 348/398 |
| 5,121,391 | 6/1992 | Paneth et al. | 370/95.1 |
| 5,179,730 | 1/1993 | Loper | 455/266 |
| 5,216,719 | 6/1993 | Oh | 348/398 |
| 5,280,636 | 1/1994 | Kelley et al. | 455/131 |

OTHER PUBLICATIONS

Vaidyanathan, P. P., "Quadrature Mirror Filter Banks, M-Band Extensions and Perfect-Reconstruction Techniques", *IEEE ASSP Magazine*, Jul. 1987, pp. 4–20.
Rothweiler, Joseph H., "Polyphase Quadrature Filters—A New Subband Coding Technique", *ICASSP 83, Boston*, 1983, Sponsored by: IEEE, pp. 1280–1283.
Vaidyanathan, P. P., "Theory and Design of M-Channel Maximally Decimated Quadrature Mirror Filters with Arbitrary M., Having the Perfect-Reconstruction Property", *IEEE Transactions on Acoustics, Speech, and Signal Processing*, vol. ASSP-35, No. 4., Apr. 1987, pp. 476–492.
Millar, Paul C., "Recursive Quadrature Mirror Filters—Criteria Specification and Design Method", *IEEE Transactions on Acoustics, Speech, and Signal Processing*, vol. ASSP-33, No. 2, Apr. 1985, pp. 413–420.
Vaidyanathan, P. P. and Swaminathan, Kumar, "Alias-Free, Real-Coefficient m-Band QMF Banks for Arbitrary m", *IEEE Transactions on Circuits and Systems*, vol CAS-34, No. 12, Dec. 1987, pp. 1485–1496.
Bjerede, B. E., Bartlow, G., Bartley, T., Clayton, K., Fisher, G. Smith, C., "Digital Processing Receiver", Prepared for: Rome Air Development Center, Feb. 1975, Distributed by: National Technical Information Service, U.S. Department of Commerce.

*Primary Examiner*—Edward L. Coles, Sr.
*Assistant Examiner*—Madeleine Nguyen
*Attorney, Agent, or Firm*—Shawn B. Dempster; Daniel C. Crilly

[57] ABSTRACT

A method and apparatus are provided for receiving electromagnetic radiation within a frequency band. The receiving is accomplished by intercepting electromagnetic radiation within the frequency band and converting the intercepted electromagnetic radiation into an electrical signal. Subsequently, a portion of the electrical signal is digitized into digitized signals. Each digitized signal represents the intercepted electromagnetic radiation within a portion of the frequency band. Finally, a composite digitized signal is generated from at least two of the digitized signals. Alternatively, the receiving process may be enhanced by intercepting first electromagnetic radiation within a portion of the frequency band and by intercepting second electromagnetic radiation within another portion of the frequency band. Subsequently, the first and the second electromagnetic radiation is combined into a composite electromagnetic radiation waveform. The composite electromagnetic radiation waveform is converted into an electrical signal which may be processed into digitized signals which form a composite digitized signal.

59 Claims, 5 Drawing Sheets

METHOD AND APPARATUS FOR RECEIVING ELECTROMAGNETIC RADIATION WITHIN A FREQUENCY BAND

FIELD OF THE INVENTION

The present invention relates to receivers which digitize an electromagnetic radiation within a frequency band, and more specifically to a multi-channel receiver which detects narrowband or wideband information signals, with identical receiver circuitry, from a plurality of digitized signals which represent the intercepted electromagnetic radiation.

BACKGROUND OF THE INVENTION

Receivers for communication systems generally are designed such that they are tuned to receive one of a multiplicity of signals having widely varying bandwidths and which may fall within a particular frequency range. It will be appreciated by those skilled in the art that these receivers intercept electromagnetic radiation within a desired frequency band and convert the intercepted electromagnetic radiation into an electrical signal. The electromagnetic radiation can be input to the receiver by several types of devices including an antenna, a wave guide, a coaxial cable, an optical fiber, and a transducer. Through appropriate filtering techniques the desired portion of the electrical signal is selected and subsequently processed by either analog or digital signal processing techniques.

These communication system receivers may be capable of receiving signals known as narrow band or wide band signals; however, such receivers generally utilize circuitry which is duplicated for each respective signal to be received which has a different bandwidth. Thus, in such a receiver, a narrow band signal would only pass through a narrow band filter and the wide band signal only would pass through a wide band filter. The output of each filter subsequently would be selected depending upon the mode of operation that is desired for the receiver. The disadvantage to this type of receiver is that circuitry must be duplicated for each desired signal having a different bandwidth which is to be received. In addition, the bandwidth of each desired signal must be known a priori so that the filtering and signal processing stages may be properly designed. If a receiver is designed for a specific channel bandwidth and a new communication service is later introduced which requires a different bandwidth (i.e., a different signal coding and channelization standard) which was not anticipated, then a completely new receiver capable of supporting this new bandwidth will need to be designed and utilized.

An alternative receiver structure is possible which would be capable of receiving either narrow band or wide band signals. This alternative receiver may utilize a digitizer which operates at a sufficiently high sampling rate to ensure that the wide band signal can be digitized in accordance with the Nyquist criteria (i.e., digitizing at a sampling rate equal to at least twice band width to be digitized). Subsequently, the digitized wide band signal preferably is processed using digital signal processing techniques. The digitizer typically also includes an anti-aliasing filter which is sufficiently wide to pass the wide band signal. Thus, the receiver is essentially designed as one which uses a wide bandwidth detector or digitizer.

The post digitizer digital signal processing algorithms may process the single output from the digitizer such that the wide band signal is operated upon for whatever filtering or detection criteria is desired, such that a set of narrow band filters and associated algorithms to effect a multi-channel narrow bandwidth receiver may be applied to this single digitized output. Such a structure is essentially equivalent to a single wide band front end in the receiver followed by a bank of narrow bandwidth filters to provide a number of outputs. It will be appreciated by those skilled in the art that one possible technique for providing this type of receiver structure is the use of Discrete Fourier Transforms (DFT's) or similar digital filtering techniques, to synthesize a series of adjacent narrow bandwidth filters after digitization.

The disadvantage to this alternative type of receiver is that the digitizer portion of the receiver must have a sufficiently high sampling rate to ensure that the Nyquist criterion is met for the maximum bandwidth of the composite received channel which is equal to the sum of the individual adjacent narrow band channels comprising the composite bandwidth. If the wide bandwidth signal is sufficiently wide, the digitizer may be very costly and may consume a considerable amount of power. Furthermore, high performance receivers which require high dynamic range also typically require the digitizer to internally generate only low levels of spurious signals. This low spurious signal requirement is difficult to achieve with practical wide bandwidth digitizers, especially if the digitizers have a multiplicity of signals input with potentially large variations in the signal power levels of the individual signals which are to be received. Additionally, the channels produced by a DFT filtering technique must typically be adjacent to each other and as such the maximum bandwidth over which such a receiver may be operated and still process a multiplicity of narrower bandwidth channels is necessarily restricted to N times the number of possible narrow bandwidth channels.

Therefore, a need exists for a receiver capable of receiving a wide band signal within a channel and a multiplicity of narrow band signals within corresponding channels with the same receiver circuitry. This receiver circuitry preferably should not include the use of a high rate digitizer having low level spurious noise constraints. This receiver circuitry also preferably would allow independent tuning of the receiver to individual narrow band channels at a desired center frequency. In addition, the narrow band channel reception should be configured such that the receiver outputs may be used individually as narrow band channels or in combination with each other to synthesize a wide band channel.

Such a flexible receiver architecture would, for example, be ideally suited for cellular radio communication systems. Currently, cellular operators are developing plans to operate service regions within their cellular systems in accordance with one or more information signal coding and channelization standards (i.e., air interface standards). If the cellular operators were to use current receiver design techniques, then a new receiver would have to be designed and built for each new information signal coding and channelization standard. However, this approach may be inadequate or at the very least not cost effective for cellular operators during the present and likely future business climate in which cellular operators are pressured to adopt new standards more quickly to satisfy growing demand for more and better communication services. As a result of these pressures cellular operators may find it desirable to deploy a receiver in their service regions which can be reconfigured, at will, to simultaneously receive one or more different types of information signals which may be present as electromagnetic radiation within a particular frequency band with the same receiver circuitry, rather than separate receiver circuitry for each type of information signal. These information signals may be coded and channelized as frequency division multiple access signals, time division multiple access signals, frequency hopping code division multiple access signals, or direct sequence code division multiple access signals. Some of these coding and channelization approved and proposed standards have been given specific names including: Advanced Mobile Phone Service (AMPS), Narrow Advanced Mobile Phone Service (NAMPS), Total Access Communication System (TACS), Japanese Total Access Communication System (JTACS), United States Digital Cellular (USDC), Japan Digital Cellular (JDC), Groupe Special Mobile (GSM), Direct Sequence Spread Spectrum (DS-SS), Frequency Hopping Spread Spectrum (FH-SS), Cordless Telephone 2 (CT2), Cordless Telephone 2 Plus (CT2 Plus), and Cordless Telephone 3 (CT3).

SUMMARY OF THE INVENTION

A method and apparatus are provided for receiving electromagnetic radiation within a frequency band. The receiving is accomplished by intercepting electromagnetic radiation within the frequency band and converting the intercepted electromagnetic radiation into an electrical signal. Subsequently, a portion of the electrical signal is digitized into digitized signals. Each digitized signal represents the intercepted electromagnetic radiation within a portion of the frequency band. Finally, a composite digitized signal is generated from at least two of the digitized signals. Alternatively, the receiving process may be enhanced by intercepting first electromagnetic radiation within a portion of the frequency band and by intercepting second electromagnetic radiation within another portion of the frequency band. Subsequently, the first and the second electromagnetic radiation are combined into a composite electromagnetic radiation waveform. The composite electromagnetic radiation waveform is converted into an electrical signal which may be processed into digitized signals which form a composite digitized signal.

DETAILED DESCRIPTION

Figure 1:
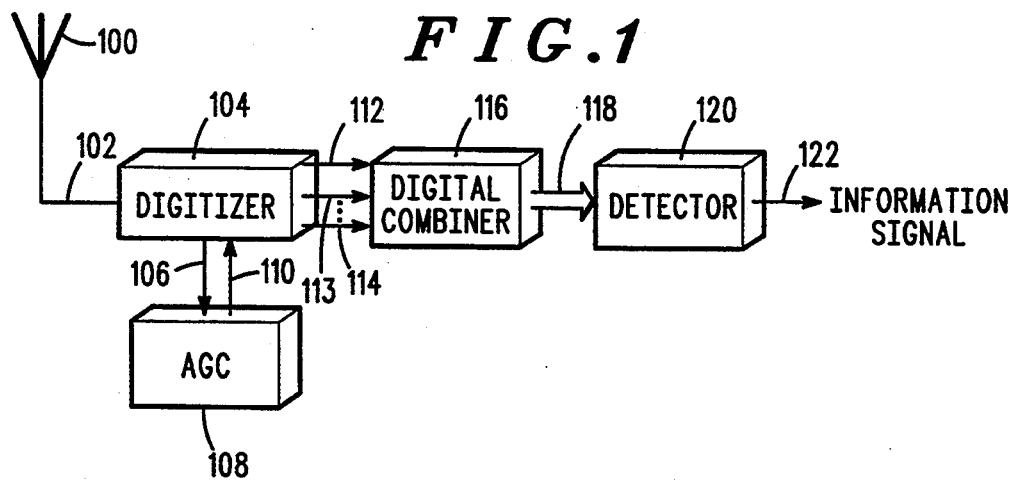
FIG. 1 is a block diagram showing a preferred embodiment receiver in accordance with the present invention.

The preferred embodiment receiver (i.e., communication unit) in accordance with the present invention as described below permits the reception of one or more channels, the number of channels which can be received is determined by the frequency bandwidth of the signals to be received. A digitizer component of the preferred embodiment receiver which utilizes a multiplicity of narrow bandwidth anti-aliasing filters and analog-to-digital converters and appropriate signal processing algorithms permits the same receiver circuitry to be used for either multiple narrow bandwidth signal reception or a single wide bandwidth channel reception when the bandwidth of the wide band signal is not greater than the sum of bandwidths of the individual narrow bandwidth digitizing sub-blocks. Any combination of coded and channelized signal in between these bounds may be obtained and the channelization is not restricted to immediately adjacent channels within a frequency band. The receiver's channel bandwidths may also be modified by changing the signal processing algorithms only. This allows the rouse of existing hardware and minimizes the need to replace hardware when the air interface standards of the communication system (e.g., cellular radiotelephone, paging, or any other wireline or wireless communication system) changes or is expanded.

The preferred embodiment receiver also solves some of the inherent problems associated a traditional wide bandwidth receiver which has a single analog-to-digital (A/D) converter. In the traditional receiver, the A/D converter converts a wide bandwidth containing a multiplicity of narrow bandwidth signals is subjected to a stringent requirement for an exceptionally wide dynamic range if the strongest and weakest of the available signals are to be recovered, each with their full dynamic range, especially if the signals have been subjected to a fading channel such that found in mobile communication systems. As an example, suppose that there is a 60 decibel (dB) range between the minimum and maximum acceptable signal levels for a mobile communication system. In addition, assume that a 30 dB signal to noise ratio is required to reproduce the signals faithfully. These assumptions lead to a 90 dB dynamic requirement for the A/D converter. Furthermore, the dynamic range requirement may be even greater when signal fading is accounted for in the system design. Within this dynamic range the digitization must be highly linear. Consequently, an increasing number of bits are required to represent the wideband of frequencies. An increasing number of bits, in turn, represents a longer conversion time for the A/D converter which is contrary to the need to sample the wide bandwidth signal in real time (i.e., during voice communications).

In addition, automatic gain control cannot effectively be utilized over its maximum range and over the entire received bandwidth to mitigate this effect, because, by doing so, the weaker signals within the side bandwidth will be attenuated.

In contrast, a preferred embodiment receiver consisting of a multiplicity of narrow bandwidth A/D converters which each operate on one of the individual desired narrow band signals results in each of the A/D converters is subjected to essentially only the desired signal or a smaller subset of signals from the total bandwidth. This results in the need for fewer bits out of the A/D converters to represent a given narrow bandwidth and allows for automatic gain control to be applied to each of the narrow bandwidth signals which can further ease the burden on the A/D converter dynamic range requirements.

As previously noted, a single wide bandwidth A/D converter is subjected to a stringent requirement for exceptionally high linearity. This is to minimize the generation of intermodulation products which can be generated and may fall on frequencies within the received band of interest (i.e., cause interference to other desired signals). Such high linearity requirements are generally expensive to implement and are in some cases subject to variation with environmental factors (e.g., temperature, supply voltages, age, etc) which can degrade performance.

In contrast, when individual narrow bandwidth receivers are used, especially for the reception of a multiplicity of narrow bandwidth signals, the receiver gain stages and the A/D converter, used in the digitizer, need not have as stringent a linearity requirement, because these circuits are not generally subjected to signals outside of the frequency band of interest (i.e., proximate the narrow bandwidth signal to be received). In addition, they inherently will have fewer internally generated spurious signals that can interfere with the desired signals.

Referring now to FIG. 1, a block diagram of a first preferred embodiment receiver in accordance with the present invention is shown. The preferred embodiment receiver is preferably is included within a communication unit (e.g., a cellular base station, a cellular portable phone, a patio phone, a pager, or a trunked radio) for receiving electromagnetic radiation within a frequency band. The communication unit also typically includes transmitter circuitry. The receiver preferably consists of an analog front end having a low noise figure and ample protection to undesired out-of-band signals. The front end includes an input 102 which uses an antenna 100 to intercept electromagnetic radiation within the frequency band of interest and a transducer (not shown) for converting the intercepted electromagnetic radiation into an electrical signal 300 (shown in FIGS. 6, 7, and 8) carried on input 102. It will be appreciated by those skilled in the art that other types of input devices may be used for intercepting or capturing electromagnetic radiation. For example a wave guide, a coaxial cable, an optical fiber, or an infrared frequency transducer may be used to intercept electromagnetic radiation for subsequent input into the preferred embodiment receiver.

Figure 6:
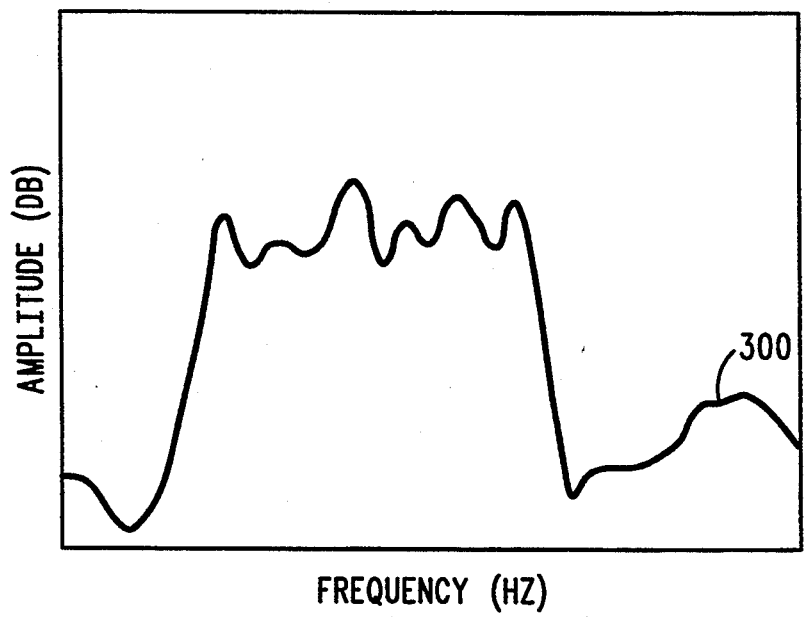
FIG. 6 shows a frequency domain representation of an electrical signal derived from electromagnetic radiation intercepted from a frequency band in accordance with a preferred embodiment of the present invention.
Figure 7:
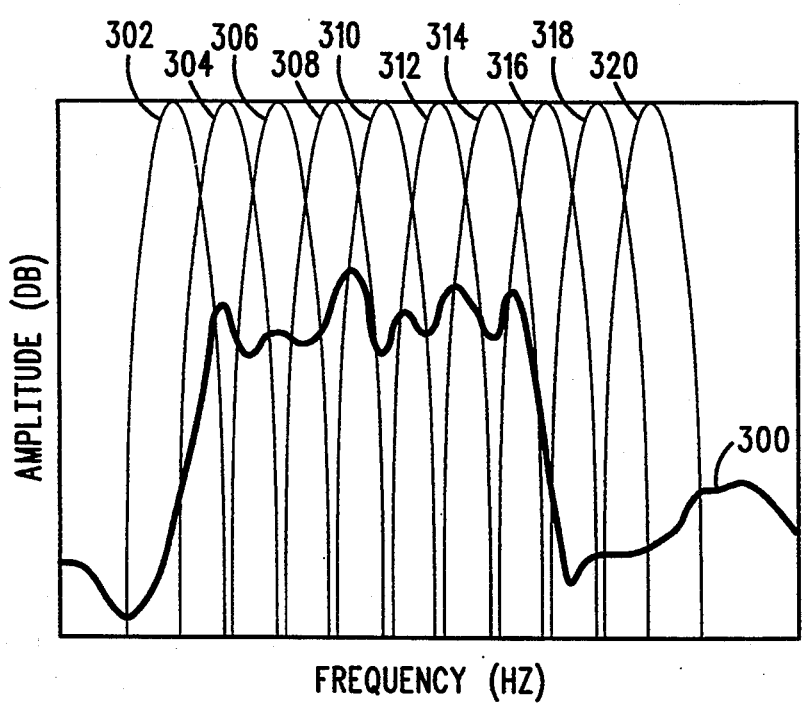
FIG. 7 shows a frequency domain representation of the electrical signal shown in FIG. 6 overlaid by ten analog narrow band overlapping channels which are combined in accordance with the preferred embodiment of the present invention to form a wide band channel.
Figure 8:
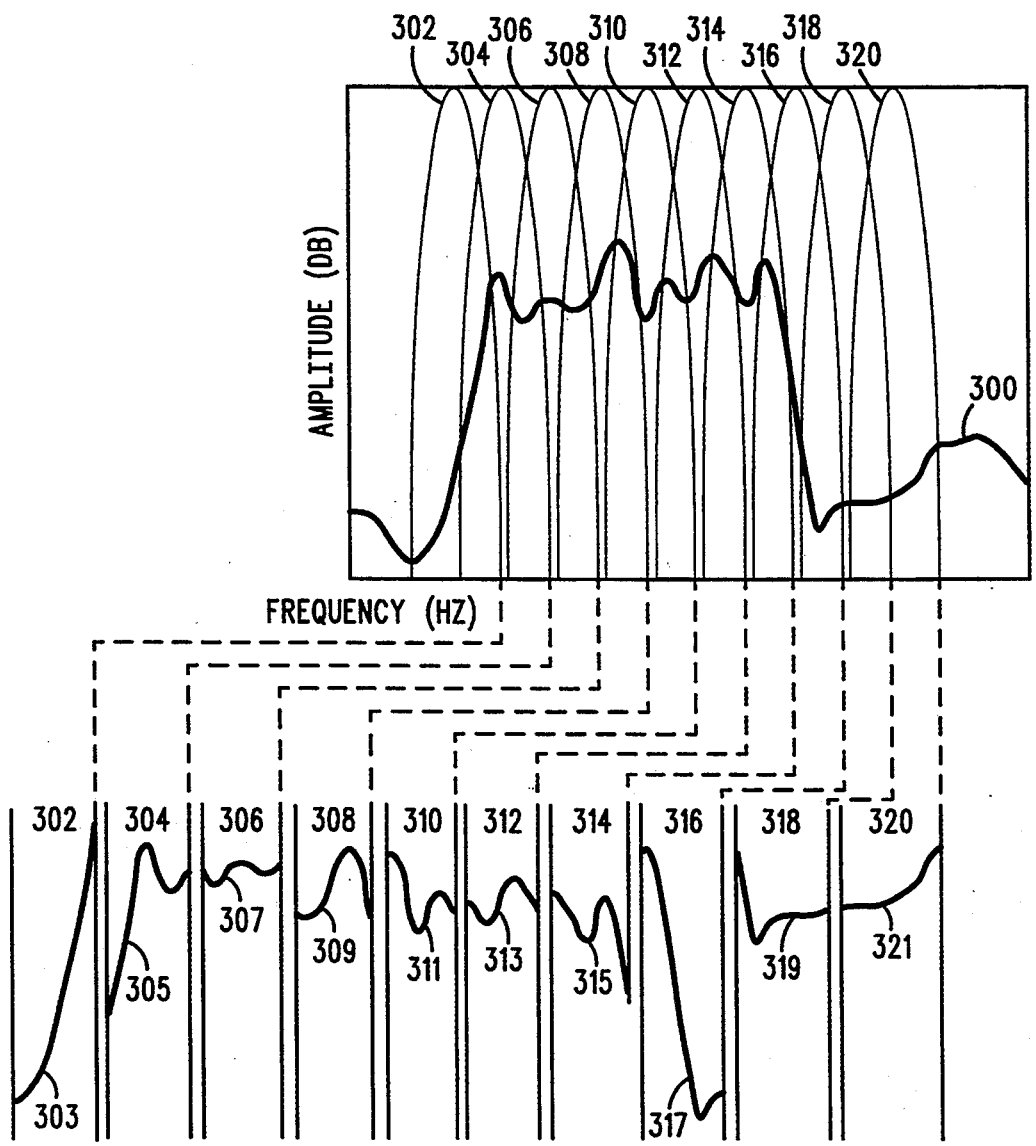
FIG. 8 shows which portion of the electrical signal shown in FIG. 6 is received by each analog narrow band overlapping channel shown in FIG. 7 in accordance with the preferred embodiment of the present invention.

By way of example, an electrical signal 300 is shown in FIG. 6. This electrical signal 300 represents the relative amplitude (i.e., vertical scale) of the frequency components (i.e., horizontal scale) of intercepted electromagnetic radiation. The electrical signal 300, carried on input 102, preferably is operatively coupled to a digital back end including a digitizing device 104 which digitizes a portion of the electrical signal 300 into a plurality of digitized signals 112, 113, and 114. As shown in FIG. 7, the electrical signal 300 is divided, by the digitizing device 104, into a number of portions with a corresponding number of bandpass filters (e.g., bandpass filters 302, 304, 306, 308, 310, 312, 314, 316, 318, and 320). These bandpass filters 302, 304, 306, 308, 310, 312, 314, 316, 318, and 320 preferably divide a portion of the electrical 300 into several overlapping signal portions (e.g., overlapping signals portions 303, 305, 307,309, 311,313, 315, 317, 319, and 321, respectively, as shown in FIG. 8). The overlapping signal portions 303, 305, 307,309,311,313,315,317, 319, and 321 preferably are converted by analog-to-digital converters into a plurality of digitized signals. For convenience in the following narrative, only three digitized signals (e.g., digitized signals 112, 113, and 114) are shown; however, it will be appreciated by those skilled in the art that the principles described herein may be readily extended to more than or less than three digitized signals without departing from the scope and spirit of the present teachings. Each digitized signal 112, 113, and 114 represents the intercepted electromagnetic radiation within a portion of the frequency band (e.g., electric signal portions 303, 305, and 307, respectively, shown in FIG. 8).

The preferred embodiment receiver may also include an automatic gain controller (AGC) 108 which is operatively coupled within the preferred embodiment receiver prior to a digital combiner 116 (e.g., the AGC 108 may be coupled 106 and 110 to the digitizing device 104). The AGC 108 maintains the amplitude of the electrical signal 300 within a predetermined dynamic range of signal power. By controlling the electric signal's 300 power, the AGC 108 provides the advantage of reducing the required dynamic range of each analog-to-digital converter within digitizing device 104 whereby fewer bits are needed to represent a portion of the analog electrical signal 300 in the digital domain. This can lead to significant cost and complexity savings in a receiver which includes several analog-to-digital converters.

The three digitized signals 112, 113, and 114 preferably are operatively coupled to a digital combiner 116 which generates a composite digitized signal 118 from the three digitized signals 112, 113, and 114. Finally, a detector 120 preferably is coupled to the digital combiner 116 which detects an information signal 122 within the composite digitized signal 118. The information signal 122 preferably conforms with one of several signal coding and channelization standards. These standards include frequency division multiple access, time division multiple access, frequency hopping code division multiple access, and direct sequence code division multiple access signal coding and channelization standard.

The unique capability of the present invention to efficiently process different portions of a band of frequencies which may be widely spaced may be demonstrated as follows. Assume that a traditional wide bandwidth receiver was used to accomplish the narrow bandwidth channelization through the use of DFT processing. Further, assume the maximum pass band of the analog front end filtering is 30 MegaHertz (MHz). Furthermore, assume that the maximum sampling rate of the analog to digital converter were such that only 10 MHz of contiguous spectrum can be processed according to the Nyquist criterion for bandpass signals. Then, it is quite possible that only a 5 MHz portion of the contiguous 10 MHz contains useful signals to be received. In addition, an additional 5 MHz of spectrum to be received is located within the pass band of the receiver front end, but are outside of the contiguous 10 MHz that can be processed using the receiver. Thus, the receiver is only 50% utilized. A second such receiver would be required to receive and process the second 5 MHz band of frequencies within the 30 MHz of the receiver's front end. This second receiver would also only be 50% utilized, for a total equipment utilization efficiency of 25%.

However, if a receiver in accordance with the teachings of the present invention is now analyzed, assume that it too has a maximum front end bandwidth of 30 MHz and that there are two groups of 5 MHz bands each with a set of signals to be received that are also spaced greater than 10 MHz apart. In addition, assume that the maximum possible composite bandwidth of the new receiver to be limited to 10 MHz as dictated by the maximum bandwidth of each of the narrow bandwidth digitizers and the number of such digitizers. In this case, because a preferred embodiment receiver has the ability to tune a portion of its digitizers to a different center frequency, half of the narrow bandwidth digitizers can be tuned to one 5 MHz frequency band and the remaining half can be tuned to the second 5 MHz frequency band. This receiver is therefore 100% utilized and only one multi-channel receiver is required.

Another benefit of a preferred embodiment receiver is the ability to accommodate new allocations of radio services which require different channel bandwidths. To demonstrate the ability of the preferred embodiment receiver, assume the existence of a radio service which uses adjacent 25 kilohertz (kHz) channels to provide 1000 such channels over a bandwidth of 25 MHz. A communication unit capable of transmission and reception on a subset of these channels is in place to provide service for this communication system. Further assume that typically twenty or more of these channels may be in use at any time at one communication unit. However, it is desired to introduce a second radio service which shares the same spectrum of the present communication system and it is also desired to minimize the cost of new equipment needed to support the new communication system. Furthermore, at each communication unit, the new service will use a wide bandwidth channel equal to eight times the bandwidth of the narrow bandwidth channels for a bandwidth of 200 kHz. There would be one hundred twenty-five such channels possible in the same 25 MHz of spectrum. The wide bandwidth channels will simply replace eight contiguous narrowband channels at a communication unit.

If a preferred embodiment receiver of the present invention were utilized, it may be designed such that eight narrowband channels are supported by one receiver. The actual number is somewhat arbitrary and would be selected on the basis of technical and business decisions that would maximize the product's usefulness. Additionally, three such receivers may be present at a base station giving a total capacity of twenty-four narrowband channels. When the new service is to be introduced, at least one of these receivers of the present invention is selected to be programmed such that each of the eight narrowband receivers is tuned to contiguous channels that now comprise the wide bandwidth channel and the signal processing algorithms are loaded into the receiver to process the outputs of the digitizers as one composite signal rather than eight individual signals. No additional hardware is needed up to the point of demodulation and only new software is needed to control the digital signal processing. The communication unit owner, thus, has maximized his/her investment savings in the transition from the narrow bandwidth service to the wide bandwidth service.

In one preferred embodiment of the present invention, a communication unit (shown in FIG. 1) includes an input 102 for intercepting a frequency band. A digitizer 104 is operatively coupled to the input 102 which carries the electrical signal 300 that represents the intercepted frequency band. The digitizer 104 includes a plurality of frequency selectors which select portions of the electric signal 300. It will be appreciated by those skilled in the art that either contiguous (e.g., portions 303 and 305) or non-contiguous portions (e.g., portion 303 and 307) of the electric signal 300 may be selected. This ability to selected non-contiguous portions can be particularly useful to system designers who are overlaying one communication over another communication system. In such a situation, the system designer may configure the preferred embodiment receiver to notch out particular strong undesired frequency components (e.g., for one communication system) of the intercepted frequency band so that the analog-to-digital converter dynamic range requirements can be reduced (e.g., for the other communication system).

Figure 2:
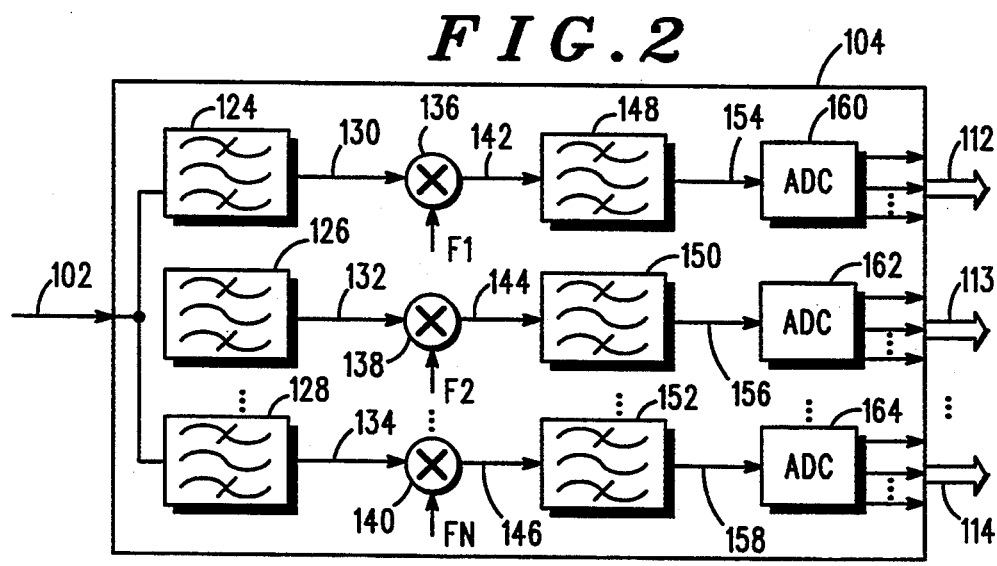
FIG. 2 is a block diagram showing a preferred embodiment digitizer in accordance with the present invention for use in the preferred embodiment receiver shown in FIG. 1.

Each frequency selector preferably includes a band pass filter 124, 128, and 128, respectively, (shown in FIG. 2) that selects a particular portion 130, 132, and 134, respectively, of the electrical signal 300. In addition, a low noise amplifier (not shown) may amplify the electric signal portions (e.g., portions 303, 305, and 307). It should be understood by one of ordinary skill in the art that the functions performed by these elements may well be distributed among several such elements, in for example a cascade connection of such elements, rather than being constructed from to only two specific elements. Such a distribution may be dictated by the particular design constraints of the receiver application.

These particular selected portions preferably are provided on outputs 130, 132, and 134 to down converters (which are other components of each frequency selector). The down converter consisting of a mixer 136, 138, and 140, a frequency agile local oscillator F1, F2, and F3 as well as band pass filter 148, 150, and 152, respectively. Each of the multiplicity of down converters is tuned to a different frequency (e.g., F1, F2, and F3), hereafter referred to as a channel within the operating frequency band. Each channel may be adjacent to one another or may be at some other specified spacing. By way of example, one down converter (i.e., frequency translator) consists of the output 130 providing the band passed filtered selected electrical signal portion to one input of mixer 136. A local oscillator provides a frequency F1 to the other input of the mixer 136. Mixer 136 generates a down converted signal portion 142 which is band pass filtered by filter 148 to eliminate undesired out-of-band frequency components to generate a baseband frequency selector output 154. It will be appreciated by those skilled in the art that baseband frequency selector outputs 156 and 158 made be generated in a similar manner. Also, it will be appreciated by those skilled in the art that the local oscillator function may be implemented by a non-frequency-hopping synthesizer or a frequency hopping synthesizer without departing from the scope and spirit of the present invention. In addition, it will be appreciated by those skilled in the art that each down converter may consist of a series of cascaded frequency selectors which input a signal in a particular frequency band, mix the signal down to one or more intermediate frequency bands, and subsequently mixes the signal to a baseband.

For the present invention to perform the function of synthesizing a wide bandwidth signal from a set of narrow bandwidth signals by the superposition principle, it is necessary to strictly control the filtering characteristics of the narrow bandwidth channels such that their characteristics are known and reproducible. This characteristic then allows the reconstruction of a wide bandwidth signal by knowing the proper amplitude and phase relationship of each narrow channel segment. Subsequently, through techniques which are known to those skilled in the art of signal processing, the narrow bandwidth segments may be combined together to form a wide bandwidth signal, while accounting for any amplitude and phase characteristics (e.g., particularly at the band edges of the narrow channels). The ability to control these characteristics is best handled in the digital domain since the filter coefficients of the digital filters that define the channel bandwidth do not change with external factors such as temperature and voltages of the circuit elements. Analog filters tend to vary, sometimes considerably, over such external factors and would introduce significant distortions in the reconstructed wide bandwidth signal that is composed of a multiplicity of narrow bandwidth channels. The preferred embodiment therefore uses a digitizer which is capable of digitizing the narrow bandwidth channels and performing a digital filtering operation on the resulting samples that will then precisely define the channel characteristics of amplitude and phase response.

In the preferred embodiment, a wide bandwidth digitizer 104 is constructed from a plurality of analog-to-digital converters 160, 162, and 164, each of which generates a plurality of digitized signals 112, 113, and 114, respectively. Each analog-to-digital converter 160, 162, and 164, is operatively coupled to one of the plurality of frequency selector outputs 154, 156, 158, respectively. In addition, each analog-to-digital converter 160, 162, and 164 samples at a rate which at least satisfies the Nyquist criterion for the bandwidth of the narrow band channel as defined by the bandpass filters 148, 150, and 152 ahead of the respective analog-to-digital converters, and a corresponding digital filter within digital combiner 116 which has programmable coefficients to precisely select the narrow bandwidth channel characteristics. This circuitry as a whole performs a frequency conversion of the input spectrum 102, selects a small portion of that spectrum through conventional bandpass filtering techniques and then uses a bandpass sampling process to generate samples of the information contained within the bandwidth of the channel.

Figure 5:
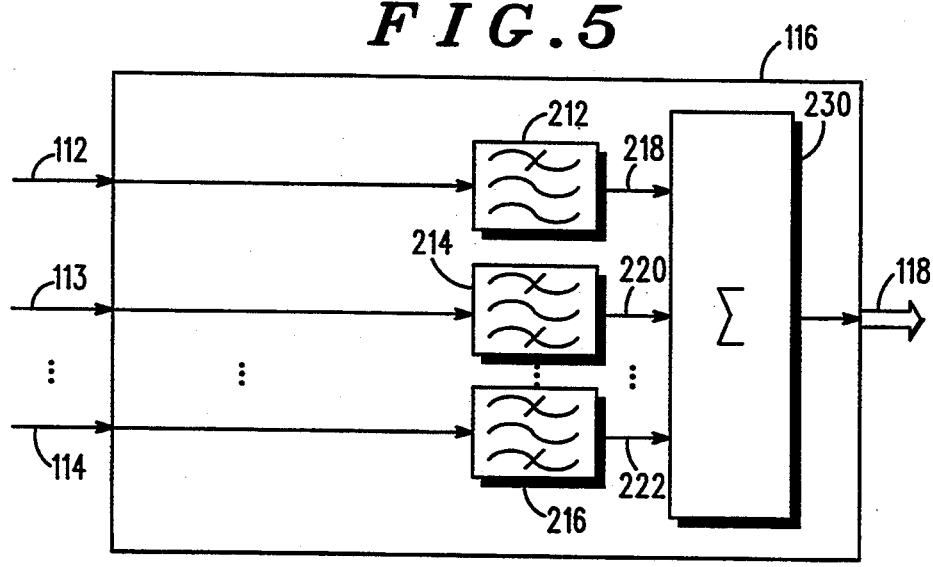
FIG. 5 is a block diagram showing a preferred embodiment of a digital combiner in accordance with the present invention for use in the preferred embodiment receiver shown in FIG. 1.

Subsequently, a digital combiner 116, which is operatively coupled to the digitizer 104 to receive digitized signals 112, 113, and 114, generates a composite digitized signal from at least two of the plurality of digitized signals 112, 113, and 114. The digital combiner 116 preferably includes digital filters (i.e., conditioners) 212, 214, and 216 (shown in FIG. 5) which further restrict the spectrum of the channel and define the channel bandwidth more precisely in terms of its amplitude and phase response. These conditioners 212, 214, and 216 preferably include one or more of the following: a frequency translator, a Fourier transformer, a quadrature mirror filter, and a polyphase filter. Further, the conditioners 212, 214, and 216 preferably filter each digitized signal with respect to a signal characteristic selected from the group consisting of optimum selectivity, controlled phase response, and controlled amplitude. In addition, digital combiner 116 preferably includes a summer 230 for summing the plurality of conditioned digitized signals provided on the respective filter 212, 214, and 216 outputs 218, 220, and 222 into the composite digitized signal 118.

A detector 120, which is operatively coupled to the combiner 116, detects an information signal 122 within the composite digitized signal 118.

Figure 3:
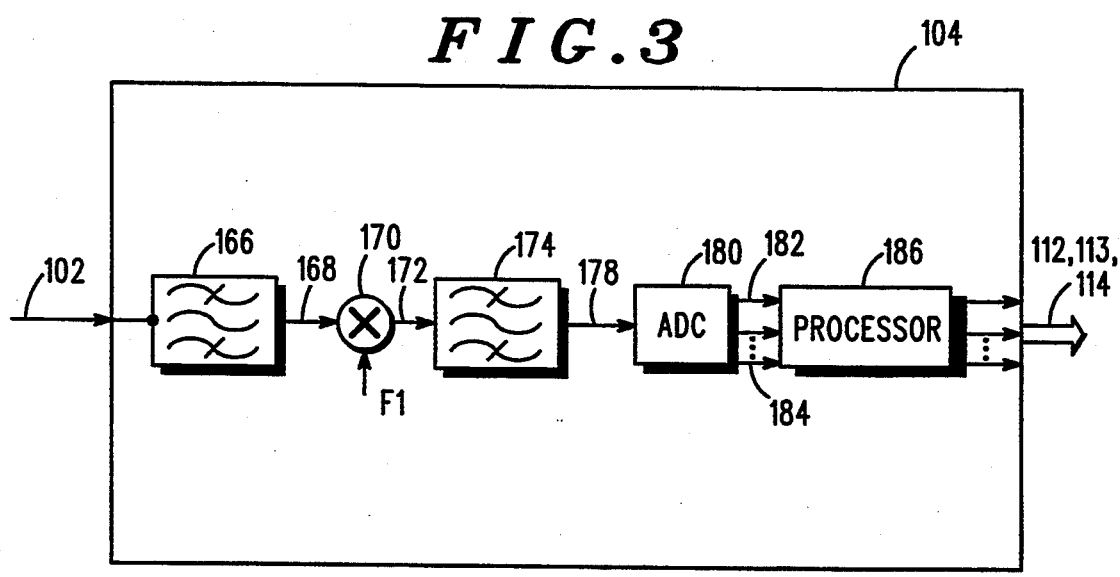
FIG. 3 is a block diagram showing an alternative preferred embodiment digitizer in accordance with the present invention for use in the preferred embodiment receiver shown in FIG. 1.

A second alternative preferred embodiment receiver, which is substantially similar to the first preferred embodiment receiver, also preferably includes an input 102 for intercepting a frequency band. A digitizer 104 (shown in FIG. 3) is operatively coupled to the input 102. The digitizer 104 includes a frequency selector for selecting the portion of the intercepted frequency band. The frequency selector includes a band pass filter 166, mixer 170, and band pass filter 174 that selects the portion of the intercepted frequency band in substantially the same manner as was described for the frequency selectors in the first preferred embodiment receiver. In addition, the digitizer further includes an analog-to-digital converter 180, which is operatively coupled to the frequency selector, for digitizing the portion of the intercepted frequency band into a digitized signal 182. The digitizer 104 preferably further includes a processor 186, which is operatively coupled to the analog-to-digital converter 180, for subdividing the digitized signal 182 into the plurality of digitized signals 112, 113, and 114. The processor 186 may consist of one or more of the following: a Fourier transformer, a quadrature mirror filter, and a polyphase filter.

Subsequently, the digital combiner 116 and the detector 120 preferably operate substantially as described in reference to the first preferred embodiment receiver.

Figure 4:
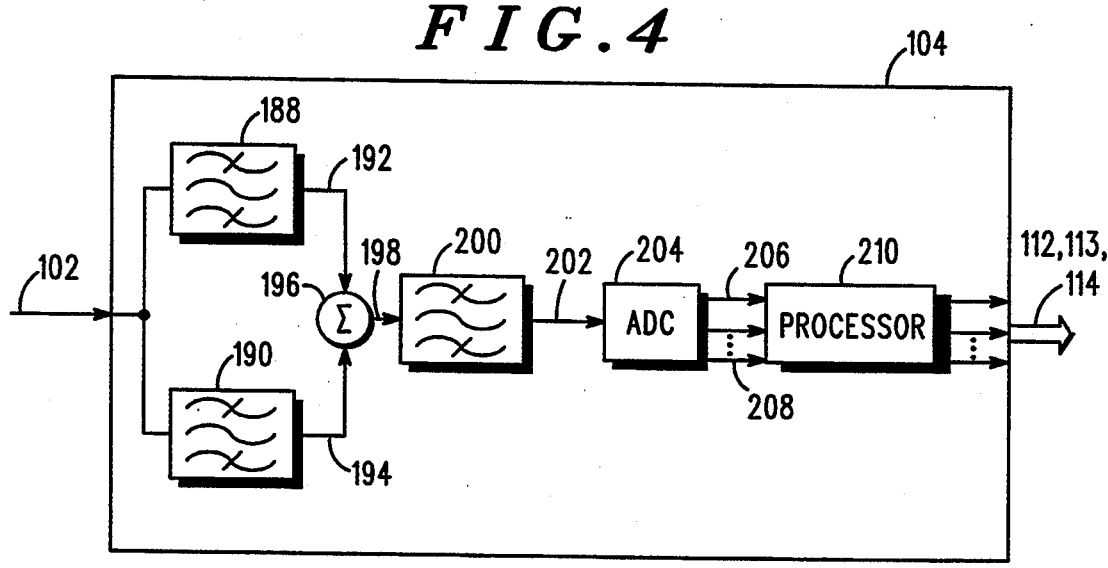
FIG. 4 is a block diagram showing another alternative preferred embodiment digitizer in accordance with the present invention for use in the preferred embodiment receiver shown in FIG. 1.

A third alternative preferred embodiment receiver, which is substantially similar to the first preferred embodiment receiver, also preferably includes an input 102 for intercepting a frequency band. A digitizer 104 (shown in FIG. 4) is operatively coupled to the input 102. The digitizer 104 includes a first frequency selector 188 for selecting a first portion 192 of the intercepted frequency band. In addition, the digitizer 104 includes a second frequency selector 190 for selecting a second portion 194 of the intercepted frequency band. Each frequency selector 188 and 190 selects a portion of the intercepted frequency band which is either contiguous or non-continuous with the other selected portion of the intercepted frequency band. In an alternative preferred embodiment, each frequency selector includes a frequency translator operatively coupled to the filter 188 and 190, respectively. Each frequency translator shifts the respective selected portion of the frequency band to a predetermined intermediate frequency such that the shifted portion of the frequency band selected by the first selector is substantially adjacent to the portion of the frequency band selected by the second selector. This enables the alternative third preferred embodiment to be configured to notch out undesired frequency bands as well as move all of the desired selected portions 192 and 194 to a single contiguous frequency band for input to the analog-to-digital converter 204. The selected portions 192 and 194 preferably are input to an electromagnetic radiation combiner 196 which combines the portions 192 and 194 into a composite intercepted frequency band 198. In addition, the digitizer further includes an analog-to-digital converter 180, which is operatively coupled to the electromagnetic radiation combiner 196, for digitizing the composite intercepted frequency band 198 into a digitized signal 206. The digitizer 104 preferably further includes a processor 210, which is operatively coupled to the analog-to-digital converter 180, for subdividing the digitized signal 206 into the plurality of digitized signals 112, 113, and 114. The processor 186 may consist of one or more of the following: a Fourier transformer, a quadrature mirror filter, and a polyphase filter.

Subsequently, the digital combiner 116 and the detector 120 preferably operate substantially as described in reference to the first preferred embodiment receiver.

Figure 9:
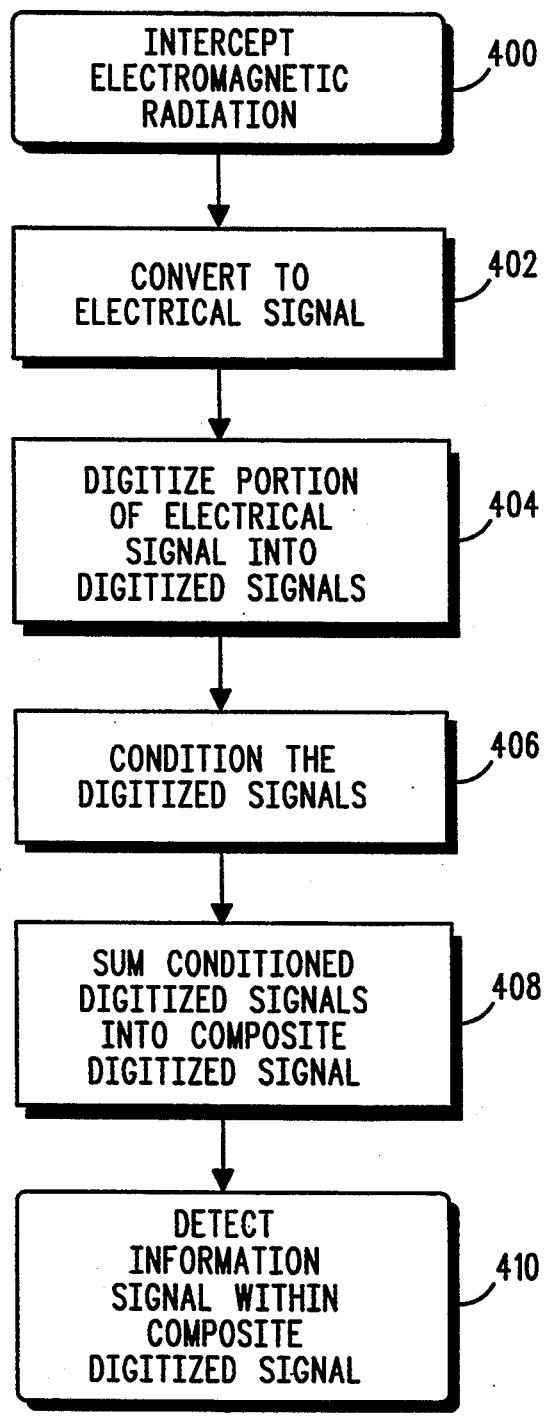
FIG. 9 shows a flowchart of a method of receiving electromagnetic radiation intercepted from a frequency band in accordance with a preferred embodiment of the present invention.

Referring now to FIG. 9, a flowchart of a method of receiving electromagnetic radiation intercepted from a frequency band in accordance with a preferred embodiment of the present invention is shown. Electromagnetic radiation within the frequency band is intercepted 400. This intercepted electromagnetic radiation is converted 402 into an electrical signal. A portion of the electrical signal is digitized 404 into a plurality of digitized signals. Each digitized signal represents the intercepted electromagnetic radiation within a portion of the frequency band.

Subsequently, a composite digitized signal is generated 406, 408 from at least two of the plurality of digitized signals. The generated composite digitized signal preferably conforms with the expected frequency bandwidth for a particular signal coding and channelization standard. The particular signal coding and channelization standard preferably is: a frequency division multiple access, time division multiple access, frequency hopping code division multiple access, or direct sequence code division multiple access communication standard. It will be appreciated by those skilled in the art that the particular digitized signals which are combined to form the composite digitized signal depends upon the particular signal coding and channelization standard to be used by the receiver.

For example, in a time division multiple access channelization scheme like GSM, the required width of frequency bandwidth interception for each channel is approximately 200 kilohertz (kHz). This width of interception can be obtain by using eight to ten digitized signals which represent overlapping 25 kHz wide portions of the frequency band to form a single composite digitized signal which represents the 200 kHz wide GSM channel (See previous discussion of FIG. 6–8 above for further details).

The composite digitized signal preferably is generated by conditioning 406 the plurality of digitized signals and summing 408 the plurality of conditioned digitized signals into the composite digitized signal. The plurality of digitized signals may be conditioned by frequency translating, Fourier transforming, quadrature mirror filtering, or polyphase filtering. In addition, each digitized signal may be filtered with respect to a signal characteristic such as optimum selectivity, controlled phase response, or controlled amplitude response. The plurality of conditioned digitized signals which are summed together may have been digitized from intercepted electromagnetic radiation within non-contiguous or contiguous portions of the frequency band (i.e., a portion of frequency band being represented may be notched out by not using certain digitized signals in the summing process).

Finally, an information signal (e.g., voice and or data) is detected 410 within the composite digitized signal. It will be appreciated by those skilled in the art that the information signal may be detected through the use of several decoding steps depending upon the particular signal coding and channelization standard to be received. For example, the composite digitized signal may need to be convolutional decoded, maximum likelihood sequence estimated, or vocoded.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed. For example, the preferred embodiment receiver as shown included ten narrowband signals which were subsequently combined into a single digitized wideband signal. However, as will be understood by those skilled in the art, any number of narrowband signals may be combined into a single digitized wideband signal. In addition, more than one wideband signal path may be formed from the several narrowband signals. Further, anti-aliasing filter imperfections may be corrected in a subsequent digital signal processing function. Furthermore, the sequence in which the signal mixing and filtering function are performed may be altered without departing from the scope and spirit of the present invention. Finally, it should be recognized that it is not necessary to digitize and sample the signals with the same sampling frequency. It is well known in the art how to manipulate through digital signal processing a sampled signal to any desired signal sampling frequency, through the processes of decimation, filtering, and interpolation. It is also well known how to combine multiple signals with different sampling rates to create a representation of a composite signal.

What is claimed is:

1. A communication unit for receiving electromagnetic radiation within a frequency band, comprising:
    (a) input means for intercepting electromagnetic radiation within the frequency band and for converting the intercepted electromagnetic radiation into an electrical signal;
    (b) digitizing means, operatively coupled to the input means, for digitizing a portion of the electrical signal into a plurality of digitized signals, each digitized signal representing the intercepted electromagnetic radiation within a portion of the frequency band; and
    (c) digital combining means, operatively coupled to the digitizing means, for generating a composite digitized signal from at least two of the plurality of digitized signals.

2. The communication unit of claim 1 wherein the input means comprises an input device selected from the group consisting of an antenna, a wave guide, a coaxial cable, an optical fiber, and a transducer.

3. The communication unit of claim 1 wherein the digitizing means comprises:
(a) a plurality of frequency selection means for selecting portions of the electrical signal, each portion representing a sub-band of the intercepted electromagnetic radiation; and
(b) a plurality of analog-to-digital conversion means for generating the plurality of digitized signals, each analog-to-digital conversion means being operatively coupled to one of the plurality of frequency selection means.

4. The communication unit of claim 3 wherein each frequency selection means comprises a filter that selects the portion of the electrical signal which represents the intercepted electromagnetic radiation within a particular portion of the frequency band.

5. The communication unit of claim 3 wherein each frequency selection means comprises a frequency translator operatively coupled to a filter that selects the portion of the electrical signal which represents the intercepted electromagnetic radiation within a particular portion of the frequency band.

6. The communication unit of claim 5 wherein each frequency translator includes a frequency manipulation device selected from the group consisting of a mixer, a non-frequency-hopping synthesizer, and a frequency hopping synthesizer.

7. The communication unit of claim 5 wherein each frequency translator comprises means for shifting the electrical signal to a predetermined intermediate frequency.

8. The communication unit of claim 1 wherein the digitizing means comprises:
(a) a frequency selection means for selecting a portion of the electrical signal, the portion representing a sub-band of the intercepted electromagnetic radiation;
(b) an analog-to-digital conversion means, operatively coupled to the frequency selection means, for digitizing the selected electrical signal portion into a digitized electrical signal portion; and
(c) processing means, operatively coupled to the analog-to-digital conversion means, for subdividing the digitized electrical signal portion into the plurality of digitized signals.

9. The communication unit of claim 8 wherein the frequency selection means comprises a filter that selects the portion of the electrical signal which represents the intercepted electromagnetic radiation within a particular portion of the frequency band.

10. The communication unit of claim 9 wherein the frequency selection means comprises a frequency translator operatively coupled to a filter that selects the portion of the electrical signal which represents the intercepted electromagnetic radiation within a particular portion of the frequency band.

11. The communication unit of claim 10 wherein the frequency translator includes a frequency manipulation device selected from the group consisting of a mixer, a non-frequency-hopping synthesizer, and a frequency hopping synthesizer.

12. The communication unit of claim 10 wherein the frequency translator comprises means for shifting the electrical signal to a predetermined intermediate frequency.

13. The communication unit of claim 8 wherein the processing means is selected from the group consisting of a Fourier transformer, a quadrature mirror filter, and a polyphase filter.

14. The communication unit of claim 1 wherein the digitizing means comprises:
(a) a first frequency selection means for selecting a portion of the electrical signal, the portion representing a sub-band of the intercepted electromagnetic radiation;
(b) a second frequency selection means for selecting a portion of the electrical signal, the portion representing another sub-band of the intercepted electromagnetic radiation;
(c) electromagnetic radiation combining means, operatively coupled to the first and the second frequency selection means, for combining the electrical signal portions selected by the first and second frequency selection means into a composite electrical signal portion;
(d) an analog-to-digital conversion means, operatively coupled to the electromagnetic radiation combining means, for generating a digitized composite electrical signal portion; and
(e) processing means, operatively coupled to the analog-to-digital conversion means, for subdividing the digitized composite electrical signal portion into the plurality of digitized signals.

15. The communication unit of claim 14 wherein each frequency selection means comprises a filter that selects the portion of the electrical signal which represents the intercepted electromagnetic radiation within a particular portion of the frequency band.

16. The communication unit of claim 14 wherein each frequency selection means comprises a frequency translator operatively coupled to a filter that selects the portion of the electrical signal which represents the intercepted electromagnetic radiation within a particular portion of the frequency band.

17. The communication unit of claim 16 wherein each frequency translator includes a frequency manipulation device selected from the group consisting of a mixer, a non-frequency-hopping synthesizer, and a frequency hopping synthesizer.

18. The communication unit of claim 16 wherein each frequency translator comprises means for shifting the electrical signal to a predetermined intermediate frequency.

19. The communication unit of claim 16 wherein each frequency translator means comprises means for shifting the electrical signal portion intercepted by the first frequency selection means to a predetermined intermediate frequency such that the shifted electrical signal portion intercepted by the first frequency selection means is substantially adjacent to the electrical signal portion intercepted by the second frequency selection means.

20. The communication unit of claim 14 wherein the processing means is selected from the group consisting of a Fourier transformer, a quadrature mirror filter, and a polyphase filter.

21. The communication unit of claim 1 further comprising an automatic gain control means, operatively coupled within the communication unit prior to the digital combining means, for maintaining the amplitude of the electrical signal within a predetermined dynamic range of signal power.

22. The communication unit of claim 1 wherein the digital combining means comprises:
  (a) conditioning means for further conditioning the plurality of digitized signals; and
  (b) summing means for summing the plurality of conditioned digitized signals into the composite digitized signal.

23. The communication unit of claim 22 wherein the conditioning means includes a signal conditioning device selected from the group consisting of a frequency translator, a Fourier transformer, a quadrature mirror filter, and a polyphase filter.

24. The communication unit of claim 22 wherein the conditioning means comprises means for filtering each digitized signal with respect to a signal characteristic selected from the group consisting of optimum selectivity, controlled phase response, and controlled amplitude response.

25. The communication unit of claim 22 wherein the summing means comprises means for summing the plurality of conditioned digitized signals which were digitized by the digitizing means from electrical signal portions which represented intercepted electromagnetic radiation within non-contiguous portions of the frequency band.

26. The communication unit of claim 22 wherein the summing means comprises means for summing the plurality of conditioned digitized signals which were digitized by the digitizing means from electrical signal portions which represented intercepted electromagnetic radiation within contiguous portions of the frequency band.

27. The communication unit of claim 1 further comprising a detecting means, operatively coupled to the digital combining means, for detecting an information signal within the composite digitized signal.

28. The communication unit of claim 27 wherein the information signal conforms with a signal coding and channelization standard selected from the group consisting of frequency division multiple access, time division multiple access, frequency hopping code division multiple access, and direct sequence code division multiple access.

29. A communication unit for receiving a frequency band, comprising:
  (a) input means for intercepting the frequency band;
  (b) a digitizer, operatively coupled to the input means, the digitizer comprising a plurality of frequency selection means for selecting portions of the intercepted frequency band, each frequency selection means comprising a filter that selects a particular portion of the intercepted frequency band, the digitizer further comprising a plurality of analog-to-digital conversion means for generating a plurality of digitized signals, each analog-to-digital conversion means being operatively coupled to one of the plurality of frequency selection means;
  (c) digital combining means, operatively coupled to the digitizing means, for generating a composite digitized signal from at least two of the plurality of digitized signals; and
  (d) a detecting means, operatively coupled to the combining means, for detecting an information signal within the composite digitized signal.

30. The communication unit of claim 29 further comprising an automatic gain control means, operatively coupled within the communication unit prior to the digital combining means, for maintaining the amplitude of the composite digitized signal within a predetermined dynamic range of signal power.

31. The communication unit of claim 29 wherein the digital combining means comprises:
  (a) conditioning means for further conditioning the plurality of digitized signals; and
  (b) summing means for summing the plurality of conditioned digitized signals into the composite digitized signal.

32. The communication unit of claim 31 wherein the summing means comprises means for summing the plurality of conditioned digitized signals which were digitized by the digitizing means from non-contiguous portions of the intercepted frequency band.

33. The communication unit of claim 31 wherein the summing means comprises means for summing the plurality of conditioned digitized signals which were digitized by the digitizing means from contiguous portions of the intercepted frequency band.

34. A communication unit for receiving a frequency band, comprising:
  (a) input means for intercepting the frequency band;
  (b) a digitizer, operatively coupled to the input means, the digitizer comprising a frequency selection means for selecting the portion of the intercepted frequency band, the frequency selection means comprising a filter that selects the portion of the intercepted frequency band, the digitizer further comprising an analog-to-digital conversion means, operatively coupled to the frequency selection means, for digitizing the portion of the intercepted frequency band into a digitized signal, the digitizer further comprising processing means, operatively coupled to the analog-to-digital conversion means, for subdividing the digitized signal into the plurality of digitized signals;
  (c) digital combining means, operatively coupled to the digitizing means, for generating a composite digitized signal from at least two of the plurality of digitized signals; and
  (d) a detecting means, operatively coupled to the combining means, for detecting an information signal within the composite digitized signal.

35. The communication unit of claim 34 further comprising an automatic gain control means, operatively coupled within the communication unit prior to the combining means, for maintaining the amplitude of the composite digitized signal within a predetermined dynamic range of signal power.

36. The communication unit of claim 34 wherein the digital combining means comprises:
  (a) conditioning means for further conditioning the plurality of digitized signals; and
  (b) summing means for summing the plurality of conditioned digitized signals into the composite digitized signal.

37. The communication unit of claim 36 wherein the summing means comprises means for summing the plurality of conditioned digitized signals which were digitized by the digitizing means from non-contiguous portions of the intercepted frequency band.

38. The communication unit of claim 36 wherein the summing means comprises means for summing the plurality of conditioned digitized signals which were digitized by the digitizing means from contiguous portions of the intercepted frequency band.

39. A communication unit for receiving a frequency band, comprising:

(a) input means for intercepting the frequency band;
(b) a digitizer, operatively coupled to the input means, the digitizer comprising:
   (i) a first frequency selection means for selecting a portion of the intercepted frequency band;
   (ii) a second frequency selection means for selecting another portion of the intercepted frequency band;
   (iii) electromagnetic radiation combining means, operatively coupled to the first and the second frequency selection means, for combining the portions of the frequency band intercepted by the first and second frequency selection means into a composite intercepted frequency band;
   (iv) an analog-to-digital conversion means, operatively coupled to the electromagnetic radiation combining means, for generating a digitized composite intercepted frequency band; and
   (v) processing means, operatively coupled to the analog-to-digital conversion means, for subdividing the digitized composite intercepted frequency band into the plurality of digitized signals;
(c) digital combining means, operatively coupled to the digitizing means, for generating a composite digitized signal from at least two of the plurality of digitized signals; and
(d) a detecting means, operatively coupled to the combining means, for detecting an information signal within the composite digitized signal.

40. The communication unit of claim 39 wherein each frequency selection means comprises a frequency translator operatively coupled to the filter, each frequency translator means comprising means for shifting the portion of the frequency band selected by the first selection means to a predetermined intermediate frequency such that the shifted portion of the frequency band selected by the first selection means is substantially adjacent to the portion of the frequency band selected by the second selection means.

41. The communication unit of claim 39 further comprising an automatic gain control means, operatively coupled within the communication unit prior to the combining means, for maintaining the amplitude of the composite digitized signal within a predetermined dynamic range of signal power.

42. The communication unit of claim 39 wherein the digital combining means comprises:
   (a) conditioning means for further conditioning the plurality of digitized signals; and
   (b) summing means for summing the plurality of conditioned digitized signals into the composite digitized signal.

43. The communication unit of claim 42 wherein the summing means comprises means for summing the plurality of conditioned digitized signals which were digitized by the digitizing means from non-contiguous portions of the intercepted frequency band.

44. The communication unit of claim 42 wherein the summing means comprises means for summing the plurality of conditioned digitized signals which were digitized by the digitizing means from contiguous portions of the intercepted frequency band.

45. A communication unit for receiving electromagnetic radiation within a frequency band, comprising:
(a) input means for intercepting first electromagnetic radiation within a portion of the frequency band and for intercepting second electromagnetic radiation within another portion of the frequency band;
(b) electromagnetic radiation combining means, operatively coupled to the input means, for combining the first and the second electromagnetic radiation into a composite electromagnetic radiation waveform;
(c) conversion means, operatively coupled to the electromagnetic radiation combining means, for converting the composite electromagnetic radiation waveform into an electrical signal; and
(d) a digitizing means, operatively coupled to the combining means, for digitizing a portion of the electrical signal into a plurality of digitized signals, each digitized signal representing a portion of the composite electromagnetic radiation waveform.

46. The communication unit of claim 45 wherein the input means comprises means for intercepting first electromagnetic radiation within a portion of the frequency band which is non-contiguous with the portion of the frequency band from which the second electromagnetic radiation is intercepted.

47. The communication unit of claim 45 wherein the input means comprises means for intercepting first electromagnetic radiation within a portion of the frequency band which is contiguous with the portion of the frequency band from which the second electromagnetic radiation is intercepted.

48. The communication unit of claim 45 wherein the electromagnetic radiation combining means comprises summing means for summing the first and the second electromagnetic radiation into a composite electromagnetic radiation waveform.

49. The communication unit of claim 45 wherein the digitizing means comprises:
   (a) a plurality of frequency selection means for selecting portions of the composite electromagnetic radiation waveform; and
   (b) a plurality of analog-to-digital conversion means for generating the plurality of digitized signals, each analog-to-digital conversion means being operatively coupled to one of the plurality of frequency selection means.

50. The communication unit of claim 45 wherein the digitizing means comprises:
   (a) a frequency selection means for selecting a portion of the composite electromagnetic radiation waveform;
   (b) an analog-to-digital conversion means, operatively coupled to the frequency selection means, for digitizing the selected portion of the composite electromagnetic radiation waveform into a digitized composite electromagnetic waveform; and
   (c) processing means, operatively coupled to the analog-to-digital conversion means, for subdividing the digitized composite electromagnetic waveform into the plurality of digitized signals.

51. The communication unit of claim 45 wherein the digitizing means comprises:
   (a) an analog-to-digital conversion means for generating a digitized composite electromagnetic waveform; and
   (b) processing means, operatively coupled to the analog-to-digital conversion means, for subdividing the digitized composite electromagnetic waveform into the plurality of digitized signals.

52. The communication unit of claim 45 further comprising:

(a) digital combining means, operatively coupled to the digitizing means, for generating a composite digitized signal from at least two of the plurality of digitized signals; and (b) a detecting means, operatively coupled to the digital combining means, for detecting a information signal within the composite digitized signal.

53. A method for receiving electromagnetic radiation within a frequency band, comprising the steps of:

(a) intercepting electromagnetic radiation within the frequency band;

(b) converting the intercepted electromagnetic radiation into an electrical signal;

(b) digitizing a portion of the electrical signal into a plurality of digitized signals, each digitized signal representing the intercepted electromagnetic radiation within a portion of the frequency band; and (c) generating a composite digitized signal from at least two of the plurality of digitized signals, the composite digitized signal conforming with the expected frequency bandwidth for a signal coding and channelization standard selected from the group consisting of frequency division multiple access, time division multiple access, frequency hopping code division multiple access, direct sequence code division multiple access.

54. The method of claim 53 wherein the generating step comprises the steps of:

(a) conditioning the plurality of digitized signals; and (b) summing the plurality of conditioned digitized signals into the composite digitized signal.

55. The method of claim 54 wherein the conditioning step comprises a signal conditioning method selected from the group consisting of frequency translating, Fourier transforming, quadrature mirror filtering, and polyphase filtering.

56. The method of claim 54 wherein the conditioning step comprises filtering each digitized signal with respect to a signal characteristic selected from the group consisting of optimum selectivity, controlled phase response, and controlled amplitude response.

57. The method of claim 54 wherein the summing step comprises summing the plurality of conditioned digitized signals which were digitized from intercepted electromagnetic radiation within non-contiguous portions of the frequency band.

58. The method of claim 54 wherein the summing step comprises summing the plurality of conditioned digitized signals which were digitized from intercepted electromagnetic radiation within contiguous portions of the frequency band.

59. The method of claim 53 further comprising the step of detecting an information signal within the composite digitized signal.

* * * * *